United States Patent
Wildman et al.

(10) Patent No.: US 6,413,866 B1
(45) Date of Patent: Jul. 2, 2002

(54) METHOD OF FORMING A SOLUTE-ENRICHED LAYER IN A SUBSTRATE SURFACE AND ARTICLE FORMED THEREBY

(75) Inventors: Horatio S. Wildman, Wappingers Falls; Lawrence A. Clevenger, Lagrangeville; Chenting Lin, Poughkeepsie, all of NY (US); Kenneth P. Rodbell, Sandy Hook, CT (US); Stefan Weber, Fishkill, NY (US); Roy C. Iggulden, Newburgh, NY (US); Maria Ronay, Braircliff Manor, NY (US); Florian Schnabel, Hoehenkirchen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,367

(22) Filed: Mar. 15, 2000

(51) Int. Cl.$^7$ ............................................. H01L 21/44
(52) U.S. Cl. ..................... 438/688; 438/762; 438/765; 438/653; 438/627; 438/694; 438/695; 438/697
(58) Field of Search ................................ 438/586, 595, 438/688, 653, 618, 622, 643, 765, 762, 627, 694, 695, 697

(56) References Cited

U.S. PATENT DOCUMENTS

| | | | | |
|---|---|---|---|---|
| 4,489,482 A | * | 12/1984 | Keyser et al. ............... | 29/591 |
| 4,915,779 A | * | 4/1990 | Srodes et al. ............... | 156/643 |
| 5,434,104 A | * | 7/1995 | Cain et al. ................... | 438/652 |
| 5,946,589 A | * | 8/1999 | Ng et al. ..................... | 438/586 |
| 6,037,257 A | * | 3/2000 | Chiang et al. ............... | 438/687 |
| 6,242,338 B1 | * | 6/2001 | Liu et al. ..................... | 438/622 |
| 6,271,591 B1 | * | 8/2001 | Dubin et al. ................. | 257/751 |

OTHER PUBLICATIONS

Clevenger, et al., "A Novel Low Temperature CVD/PVD A1 Filling Process for Producing Highly Reliable 0.175 μm wiring/0.35 μm pitch Dual Damascene Interconnections in Gigabit Scale DRAMS", IBM/Siemens, DRAM Development Alliance.

* cited by examiner

Primary Examiner—Carl Whitehead, Jr.
Assistant Examiner—Khanh B. Duong
(74) Attorney, Agent, or Firm—Casey P. August; Gary M. Hartman; Domenica N. S. Hartman

(57) ABSTRACT

A method of enriching the surface of a substrate with a solute material that was originally dissolved in the substrate material, to yield a uniform dispersion of the solute material at the substrate surface. The method generally entails the use of a solvent material that is more reactive than the solute material to a chosen reactive agent. The surface of the substrate is reacted with the reactive agent to preferentially form a reaction compound of the solvent material at the surface of the substrate. As the compound layer develops, the solute material segregates or diffuses out of the compound layer and into the underlying substrate, such that the region of the substrate nearest the compound layer becomes enriched with the solute material. At least a portion of the compound layer is then removed without removing the underlying enriched region of the substrate. For microcircuit applications, the method can be used to enrich the surface of an aluminum line with elemental copper to improve the electromigration resistance of the line.

16 Claims, 1 Drawing Sheet

METHOD OF FORMING A SOLUTE-ENRICHED LAYER IN A SUBSTRATE SURFACE AND ARTICLE FORMED THEREBY

BACKGROUND OF THE INVENTION

1. Field of the Invention

The present invention generally relates to techniques for forming enriched surface layers in substrate surfaces. More particularly, this invention relates to a method of enriching a substrate surface with atoms of a solute dissolved in the substrate, so as to form a thin enriched surface layer containing a uniform dispersion of the solute without requiring a supplemental deposition step.

2. Description of the Prior Art

There are various applications in which it is desirable to enrich a surface of a substrate with a material different from the bulk substrate material. The intent is typically to achieve properties at the surface of the substrate that differ from the bulk substrate material, or to otherwise modify the overall properties of the substrate. One such application is for aluminum conductors (lines) typically employed as metal interconnects in semiconductor microcircuits. Aluminum lines are subject to deterioration from electromigration, which is generally the movement of atoms caused by the interaction between electrons and ions in the presence of an electric current. Enriching the grain boundaries and external interfaces of an aluminum line with copper can improve the electromigration resistance of the line by retarding aluminum diffusion. In the past, copper enrichment of aluminum lines has typically been accomplished by forming $CuAl_2$ precipitates at the grain boundaries during deposition by physical vapor deposition (PVD), such as sputtering from an aluminum target containing a small amount (e.g., up to about 2 atomic percent) of copper. However, by their very nature precipitates are laterally heterogeneous, resulting in copper-depleted zones in the otherwise enriched external surfaces, internal grains and boundaries. Consequently, the degree to which electromigration resistance of an aluminum line can be improved by conventional copper enrichment techniques is significantly limited.

From the above, it can be seen that it would be desirable to provide a method for enriching a substrate surface in a manner the yields a more uniform dispersion of the enrichment material. A particular application and advantage would be the ability to produce an aluminum line with a uniform, near-homogeneous dispersion of elemental copper in its surface to sharply limit the surface diffusion of aluminum in the line, thereby improving the electromigration resistance of the line.

SUMMARY OF THE INVENTION

According to the present inventions there is provided a method of enriching the surface of a substrate with a solute material that was originally dissolved in the substrate material, to yield a uniform dispersion of the solute material at the substrate surface. The method generally entails producing the substrate to contain a solvent material in which the solute material is dissolved, and which is more reactive than the solute material to a reactive agent. The surface of the substrate is then reacted with the reactive agent to form a reaction compound of the solvent material. Because the solvent material is more reactive than the solute material, the reaction compound of the solvent material forms at a rate greater than any potential reaction compound of the solute material. The reaction process produces a layer of the reaction compound of the solvent material at the surface of the substrate. As the compound layer develops, the solute material segregates or diffuses out of the compound layer and into the underlying substrate, such that the underlying region of the substrate nearest the compound layer becomes enriched with the solute material. At least a portion of the compound layer is then removed without removing the underlying enriched region of the substrate.

In view of the above, those skilled in the art will appreciate that the method described above can be employed to enrich the surface of an aluminum line with elemental copper. Because aluminum has a much higher free energy of oxide formation than copper, the surface of an aluminum line containing a limited amount of copper can be oxidized using a suitable oxidizing agent to produce an aluminum oxide (alumina) layer on the surface of the line. By properly controlling the oxidation rate to occur at a rate sufficiently slow to allow elemental copper to diffuse from the alumina layer into the underlying substrate, the region of the substrate immediately beneath the alumina layer is enriched with a uniform dispersion of the elemental copper from the alumina layer. Thereafter or simultaneously, the alumina layer can be thinned without disturbing the copper-enriched region so as to promote the desired effects of the copper enrichment while avoiding any detrimental effect of excess alumina at the line surface. The resulting aluminum line is characterized by a uniform, near-homogeneous dispersion of elemental copper in its surface that can significantly improve the electromigration resistance of the line.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE PREFERRED EMBODIMENT

Figure 1:
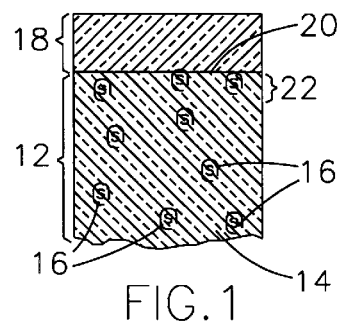
FIGS. 1 through 6 show process steps in accordance with an embodiment of this invention.

FIGS. 1 through 6 generally represent processing steps for enriching the surface of an aluminum line with elemental copper in accordance with this invention. The process described and represented in the Figures achieve the advantageous features of this invention in reference to improving the electromigration resistance of an aluminum line on a semiconductor or other suitable substrate. While the invention will be described in reference to an aluminum line, those skilled in the art will appreciate that the benefits of this invention can be applied to numerous other materials and applications that are within the scope of this invention.

The Figures schematically represent a cross-section of a surface region 12 of a metal line 10, such as an interconnect for a microcircuit. The surface region 12 is a solid solution of a solvent material 14 and a solute material 16 dissolved in the solvent material 14. According to the invention, the solvent and solute materials 14 and 16 are selected so that the solvent material 14 is more reactive than the solute material 16 to a chosen reactive agent. The line 10 is shown as having been subjected to a controlled reaction with the chosen reactive agent (as will be explained in further detail below), by which a layer 18 of a reaction compound has developed or grown on the surface 20 of the surface region 12. The line 10 preferably contains a relatively low bulk concentration of the solute material 16, so that the layer 18 is almost entirely a compound of the solvent material 14. According to this invention, atoms of the solute material 16 contained within that portion of the surface region 12 that is reacted to form the compound layer 18 are ejected or otherwise diffuse into the remaining surface region 12 beneath the layer 18. In a preferred embodiment, the reactive agent is an oxidizing agent, such that the layer 18 (i.e., the reaction compound) is an oxide of the solvent material 14, and the solvent material 14 is required to have a higher free energy of oxide formation than the solute material 16.

In the example presented by this invention, the line 10 is a solid solution of aluminum and copper, in which aluminum is the solvent material 14, copper is the solute material 16, and the layer 18 is aluminum oxide (alumina) formed by a controlled oxidation reaction. A suitable bulk concentration for copper in the line 10 is up to about 10 atomic percent (2.5 weight percent), though greater and lesser copper concentrations are within the scope of the invention. The balance of the line 10 is preferably aluminum (the solvent material 14), though it is foreseeable that other alloying additions could be present, such as silicon, titanium, titanium nitride (TiN), etc., as long as the additional constituents do not prevent the formation of the desired copper-enriched region (22 in FIGS. 1 through 6) produced by the method of this invention. While the invention will be discussed in reference to a metal line formed of an aluminum-copper alloy, various other materials are possible for the solvent and solute materials 14 and 16, as long as the solvent material 14 is more reactive than the solute material 16 to the chosen reactive agent, and the reaction compound of the solvent material 14 promotes or at least enables the diffusion of the solute material 16 into the surface region 12.

In a first process step shown in FIG. 1, the compound layer 18 has been grown at the surface 20 of the surface region 12 in such a manner that atoms of the solute material 16 have been allowed to diffuse back into the surface region 12. In the example of this invention in which the solvent material 14 is aluminum and the solute material 16 is copper, a native layer of aluminum oxide (alumina) is present prior to the process step of FIG. 1 as a result of the very high free energy of oxide formation for aluminum. In FIG. 1, the thickness of this native oxide layer has been increased by an oxidation (reaction) process to yield the oxide layer 18. The oxidation process is chosen to have kinetics that are slow relative to the diffusion processes that allow the copper atoms (solute material 16) to segregate out of the oxide layer 18 and back into the aluminum (solvent material 14) in the surface region 12. By this process, atoms of the aluminum solvent material 14 are preferentially oxidized from the surface region 12. The result is a slight enrichment of the solute material 16 within that portion of the surface region 12 immediately under the oxide layer 18, i.e., the enriched region 22.

Figure 2:
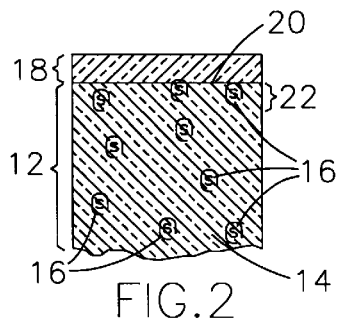
Figure 3:
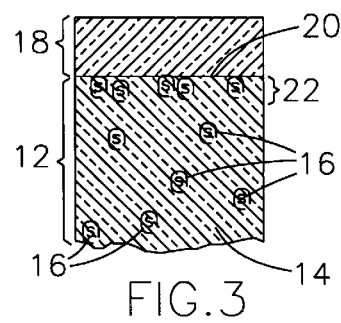
Figure 4:
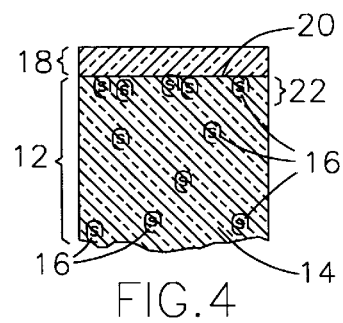
Figure 5:
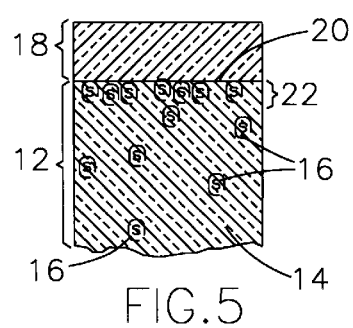
Figure 6:
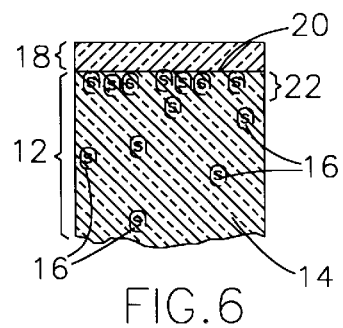

In the second process step shown in FIG. 2, the oxide layer 18 has been thinned by a process capable of removing a surface portion of the layer 18 without disturbing the enriched region 22. Various techniques are possible for this step, including chemical etching, sputter etching and mechanical polishing. In FIG. 3, the surface region 12 has undergone a second oxidation step to redevelop a thicker oxide layer 18, by which additional aluminum solvent material 14 has been oxidized from the surface region 12, again at a rate that allows atoms of the copper solute material 16 to segregate to the remaining surface region 12 beneath the oxide layer 18. As a result, the enriched region 22 of FIG. 3 contains essentially all of those atoms of the copper solute material 14 that were originally dissolved in the aluminum solvent material 14 that was oxidized to produce the oxide layers 18 of FIGS. 1 and 3. FIGS. 4 and 5 represent the results of repeating the thinning and reaction steps of FIGS. 2 and 3, respectively, with FIG. 6 representing the result of a final thinning operation to yield an enriched region 22 that contains far more atoms of the solute material 16 than was contained in the enriched region 22 represented in the previous Figures. Generally, the enriched region 22 is capable of having an elemental copper concentration of at least four times the bulk concentration of copper in the surface region 12. Importantly, the copper solute material 16 is uniformly dispersed in the region 22, contrary to the laterally heterogeneous $CuAl_2$ precipitates produced by prior art enrichment methods.

While described and portrayed as being performed in sequential steps, the present invention also encompasses a method by which the reaction and thinning steps occur simultaneously. For example, simultaneous oxidation of the surface region 12 and thinning of the resulting oxide layer 18 can be performed by a specially-constituted chemical mechanical polishing (CMP) process. The conditions for forming the copper-enriched region 22 are not the same as those conditions for efficient and smooth chemical mechanical polishing of aluminum. Precautions must be taken to prevent the pitting corrosion of aluminum that results due to the strong galvanic cell between the copper-enriched region 22 and the aluminum-rich portion of the surface region 12 beneath. The potential for corrosion is aggravated by the unfavorable cathode-to-anode surface area ratio of the copper-enriched region 22 (cathode) to the exposed aluminum (anode) in the pits. To thin the oxide layer 18 while continuously forming the copper-enriched region 22, the polishing rate of the oxide layer 18 must come to equilibrium with the oxide growth rate to maintain a sufficiently thick oxide layer 18 that allows copper to segregate out of the oxide layer 18. This can be accomplished by the use of a conventional aqueous polishing slurry to which is added a relatively strong oxidizer, such as persulfate anions ($SO_4^-$). Thermodynamics ensure that the aluminum solvent material 14 is preferentially oxidized compared to the copper solute material 16. The strong electrochemical potential provided by the persulfate ions ensures a thick equilibrium oxide (alumina) layer 18 during polishing, so that the interface between the copper-enriched region 22 and the aluminum oxide layer 18 is not disturbed by polishing. The degree of copper enrichment depends on the total amount of aluminum atoms removed by CMP. As long as aluminum can be preferentially removed, copper will continue to build up in the region 22 beneath the oxide layer 18 until a maximum concentration is reached. A dynamic mass balance is achieved when the rate of removal of copper with the oxide layer 18 during CMP equals the rate of replenishment from the surface region 12. Those skilled in the art will appreciate that the maximum degree of copper enrichment depends on the law of mass action, oxide growth rate, oxide polishing rate, and copper diffusion rate.

Figure 7:
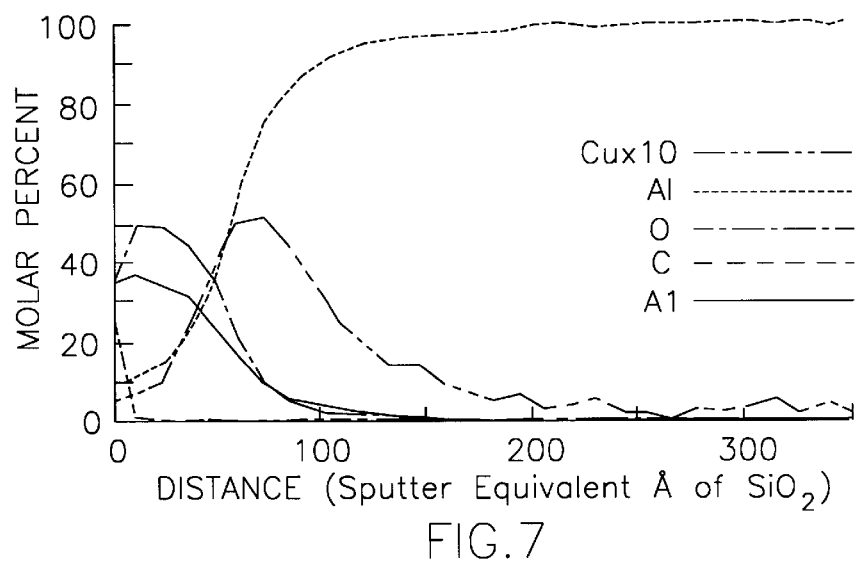
FIG. 7 is an Auger concentration depth profile of an aluminum line having a bulk copper concentration of about 0.5 weight percent, and whose surface was enriched with copper in accordance with another embodiment of this invention.

During an investigation leading up to this invention, copper-enriched regions were formed in the surfaces of aluminum lines of the type used for metal interconnects on semiconductor devices. The aluminum lines were formed by the Damascene process, described in published articles such as R. F. Schnabel et al., *Microelectronics Engineering*, 37/38, 59 (1997), and R. Iggudden et al., Proceedings of the VLSI Multilevel Interconnect Technology Conference, p.19 (1998). The bulk aluminum material used to form the lines contained about 0.5 weight percent (about 2 atomic percent) copper. The lines were planarized with the surrounding substrate material by conventional CMP optimized to polish aluminum. Copper enrichment was then performed by the modified CMP process of this invention described above, with ammonium persulfate used as the oxidizing agent and polyacrylic acid as a corrosion inhibitor in an aluminum-based slurry. This CMP process was continued for a duration sufficient to remove approximately 30 to 50 nanometers of material from the line surfaces. An Auger concentration depth profile of a processed line indicated that the region immediately beneath the surface of the line was enriched with copper by a factor of at least ten as compared to the bulk concentration of 0.5 weight percent originally present within the remainder of the line, as evidenced by FIG. 7. It should be noted that the profile underestimates the actual enrichment because of two factors that degrade the depth resolution of the profile: an escape depth effect in the Auger peak measurement and a cascade mixing effect in the sputter removal process. The escape depth effect was due to the aluminum peak being at a higher kinetic energy than the copper peak, so that the aluminum peak measures deeper regions of the line where the relative aluminum content is higher. Sputter etching was performed with argon ions at an energy level of about 3 keV. The cascade mixing effect was due to argon ion-induced collisional mixing of the enriched layer with the higher aluminum content below during sputter etching.

While the invention has been described in terms of a preferred embodiment, it is apparent that other forms could be adopted by one skilled in the art. Accordingly, the scope of the invention is to be limited only by the following claims.

What is claimed is:

1. A method comprising the steps of:
    providing a substrate comprising a solute material dissolved in a solvent material, the solvent material being more reactive than the solute material to a reactive agent;
    reacting a surface of the substrate with the reactive agent to form a reaction compound of the solvent material at a rate greater than the formation of a reaction compound of the solute material, the reaction compound of the solvent material forming a layer on the surface of the substrate, the rate at which the reaction compound is formed being controlled to promote segregation of the solute material out of the layer and into a region of the substrate adjacent the surface such that the region is enriched with the solute material; and
    removing a portion of the layer and leaving thereunder the region in the substrate adjacent the surface that is enriched with the solute material.

2. The method according to claim 1, wherein the substrate is electrically conductive.

3. The method according to claim 1, wherein the reaction compound is an oxide of the solvent material.

4. The method according to claim 1, wherein the substrate is a solid solution metallic material comprising at least one solute metal dissolved in a solvent metal.

5. The method according to claim 1, wherein the removing step entails removing an outer region of the layer so as to thin the layer.

6. The method according to claim 1, wherein the substrate is a metal interconnect of a microcircuit.

7. The method according to claim 1, wherein the reacting and removing steps are performed sequentially.

8. The method according to claim 1, wherein the reacting and removing steps are performed simultaneously.

9. The method according to claim 1, wherein the volume of the layer removed during the removing step is not greater than the volume of reaction compound produced during the reacting step.

10. The method according to claim 1, wherein the solute material is copper and the solvent material is aluminum, the substrate has a bulk concentration of copper of less than 10 atomic percent, and the region of the substrate has an elemental copper concentration of at least four times the bulk concentration of copper in the substrate.

11. A method comprising the steps of:
    providing a substrate of a solid solution material comprising a solute material dissolved in a solvent material, the solvent material having a higher free energy of oxide formation than the solute material;
    reacting a surface of the substrate to form an oxide of the solvent material at a rate greater than the formation of an oxide of the solute material, the oxide of the solvent material forming an oxide layer on the surface of the substrate, the rate at which the oxide layer is formed being controlled to promote ejection of the solute material from the oxide layer into a region of the substrate adjacent the surface such that the region is enriched with a uniform dispersion of the solute material; and
    removing an outer region of the oxide layer so as to thin the oxide layer and leave thereunder the region in the substrate adjacent the surface that is enriched with the uniform dispersion of the solute material.

12. The method according to claim 11, wherein the substrate is a metal interconnect on a semiconductor device.

13. The method according to claim 11, wherein the reacting and removing steps are performed sequentially.

14. The method according to claim 11, wherein the reacting and removing steps are performed simultaneously by chemical mechanical polishing, the volume of the oxide layer removed during the removing step being not greater than the volume of the oxide of the solvent material produced during the reacting step.

15. The method according to claim 11, wherein the solute material is copper and the solvent material is aluminum, the substrate has a bulk concentration of copper of less than 10 atomic percent, and the region of the substrate has an elemental copper concentration of at least four times the bulk concentration of copper in the substrate.

16. The method according to claim 11, wherein the solute material is copper and the solvent material is aluminum, the substrate has a bulk concentration of copper of about 2 atomic percent, and the region of the substrate has an elemental copper concentration of at least four times the bulk concentration of copper in the substrate.

* * * * *